US011211304B2

United States Patent
Otremba et al.

(10) Patent No.: US 11,211,304 B2
(45) Date of Patent: Dec. 28, 2021

(54) ASSEMBLY AND METHOD FOR MOUNTING AN ELECTRONIC COMPONENT TO A SUBSTRATE

(71) Applicant: Infineon Technologies Austria AG, Villach (AT)

(72) Inventors: Ralf Otremba, Kaufbeuren (DE); Guenther Lohmann, Sattendorf (AT); Bernd Schmoelzer, Radenthein (AT); Fabian Schnoy, Regenstauf (DE)

(73) Assignee: Infineon Technologies Austria AG, Villach (AT)

( * ) Notice: Subject to any disclaimer, the term of this patent is extended or adjusted under 35 U.S.C. 154(b) by 402 days.

(21) Appl. No.: 16/104,600

(22) Filed: Aug. 17, 2018

(65) Prior Publication Data
US 2019/0057923 A1    Feb. 21, 2019

(30) Foreign Application Priority Data
Aug. 18, 2017 (EP) .................. 17186919

(51) Int. Cl.
*H01L 23/32* (2006.01)
*H02M 7/00* (2006.01)
(Continued)

(52) U.S. Cl.
CPC ........... *H01L 23/32* (2013.01); *H01L 21/50* (2013.01); *H01L 23/08* (2013.01); *H01L 23/40* (2013.01);
(Continued)

(58) Field of Classification Search
None
See application file for complete search history.

(56) References Cited

U.S. PATENT DOCUMENTS 4,100,566 A * 7/1978 Okikawa ............ H01L 23/3107
257/675
4,259,685 A * 3/1981 Romano ............ H01L 23/4006
165/80.2
(Continued)

FOREIGN PATENT DOCUMENTS

DE  102015216779 A1  9/2016
GB     2018345 A    10/1979
(Continued)

OTHER PUBLICATIONS

English translation for JP2011035265. 7pp. Retrieved from interneton Mar. 28, 2019 at: https://patents.google.com/patent/JP2011035265A/en?oq=2011035265 (Year: 2019).*

*Primary Examiner* — David E Graybill
(74) *Attorney, Agent, or Firm* — Murphy, Bilak & Homiller, PLLC

(57) ABSTRACT

In an embodiment, an assembly includes an electronic component, a fixing member, a resilient member and a substrate having a first surface. The electronic component includes a heat-generating semiconductor device, a die pad and a plastic housing. The heat-generating semiconductor device is mounted on a first surface of the die pad, and the die pad is at least partially embedded in the plastic housing. The resilient member is engaged under compression between an upper side of the electronic component and a lower surface of the fixing member and the fixing member secures the electronic component to the first surface of the substrate.

20 Claims, 8 Drawing Sheets

(51) Int. Cl.
  *H05K 7/20* (2006.01)
  *H01L 23/08* (2006.01)
  *H01L 21/50* (2006.01)
  *H01L 23/40* (2006.01)
  *H01L 23/495* (2006.01)
  *H01L 21/60* (2006.01)

(52) U.S. Cl.
  CPC .... *H01L 23/4006* (2013.01); *H01L 23/49503* (2013.01); *H01L 23/49562* (2013.01); *H02M 7/003* (2013.01); *H05K 7/209* (2013.01); *H01L 2021/60285* (2013.01); *H01L 2224/32245* (2013.01); *H01L 2224/48091* (2013.01); *H01L 2224/48247* (2013.01); *H01L 2224/73265* (2013.01); *H01L 2924/181* (2013.01)

(56) References Cited

U.S. PATENT DOCUMENTS

| | | | | |
|---|---|---|---|---|
| 4,460,917 | A * | 7/1984 | Rogers | H01L 23/32 |
| | | | | 174/153 G |
| 4,878,108 | A * | 10/1989 | Phelps, Jr. | H01L 23/4006 |
| | | | | 257/796 |
| 5,313,381 | A * | 5/1994 | Balakrishnan | H02M 3/33507 |
| | | | | 363/131 |
| 5,396,404 | A * | 3/1995 | Murphy | H01L 23/4006 |
| | | | | 257/727 |
| 5,504,653 | A * | 4/1996 | Murphy | H01L 23/4093 |
| | | | | 257/719 |
| 5,592,021 | A * | 1/1997 | Meschter | H01L 23/4006 |
| | | | | 257/726 |
| 6,255,722 | B1 * | 7/2001 | Ewer | H01L 23/4093 |
| | | | | 257/675 |
| 6,465,728 | B1 * | 10/2002 | McLaughlin | H01L 23/4093 |
| | | | | 174/16.3 |
| 8,455,987 | B1 * | 6/2013 | Spann | H01L 21/56 |
| | | | | 257/675 |
| 2001/0018235 | A1 * | 8/2001 | Choi | H01L 23/3121 |
| | | | | 438/122 |
| 2004/0089931 | A1 | 5/2004 | Nakajima et al. | |
| 2009/0212417 | A1 * | 8/2009 | Yong | H01L 23/3121 |
| | | | | 257/712 |
| 2010/0032189 | A1 * | 2/2010 | Muto | H05K 3/301 |
| | | | | 174/252 |
| 2017/0098598 | A1 * | 4/2017 | Otremba | H01L 23/3107 |
| 2019/0057923 | A1 * | 2/2019 | Otremba | H01L 23/4006 |

FOREIGN PATENT DOCUMENTS

| | | |
|---|---|---|
| JP | S5870560 A | 4/1983 |
| JP | 2011035265 A | 2/2011 |
| JP | 2017037979 A | 2/2017 |

* cited by examiner

ASSEMBLY AND METHOD FOR MOUNTING AN ELECTRONIC COMPONENT TO A SUBSTRATE

BACKGROUND

An electronic component may include one or more semiconductor devices in a package. The package includes internal electrical connections from the semiconductor device to a substrate or a leadframe which further includes outer contacts. The outer contacts may have the form of pins or solder balls, for example, and are used to mount the electronic component on a substrate, for example a redistribution board, such as a printed circuit board. The package typically includes a housing which covers the semiconductor device and the internal electrical connections. The housing may include a plastic material, such as epoxy resin, and may be formed by a mold process, such as injection molding.

Outer contacts in the form of pins may be mounted on a surface of the substrate, in the case of surface mount devices (SMD), or in vias or through-holes which extend through the thickness of the substrate in the case of through-hole devices (THD) in order to electrically couple the pins and, therefore, the semiconductor device within the package to the substrate. During operation, the semiconductor device typically generates heat. This heat generated from the semiconductor device within the package may be encouraged to dissipate away from the device by the use of additional heatsinks attached to the package and/or by dissipation to the substrate via the plastic housing and/or the pins.

Some electronic components may also include a further mechanical connection between the package and a heatsink that is separate from the electrical connection between the pins and a redistribution board. The additional mechanical connection may be used to decrease the thermal resistance of the interface between the package and the external heatsink and improve heat dissipation.

In the case of a TO220 package for example, the electronic component includes an aperture which may be used to accommodate an additional mechanical fixing, such as a screw, which is used to mechanically secure the electronic component to an external heatsink. The external heatsink may be separate from the redistribution board. Additionally, a further thermally conductive layer may be arranged at the interface between the package and the heatsink to further reduce the thermal resistance and improve heat dissipation from the semiconductor device.

However, further improvements for mounting packaging and enabling the dissipation of heat from packages are desirable.

SUMMARY

In an embodiment, an assembly is provided that includes an electronic component, a fixing member, a resilient member and a substrate having a first surface. The electronic component includes including a heat-generating semiconductor device, a die pad and a plastic housing, wherein the heat generating semiconductor device is mounted on a first surface of the die pad and the die pad is at least partially embedded in the plastic housing. The resilient member is engaged under compression between an upper side of the electronic component and a lower surface of the fixing member and the fixing member secures the electronic component to the first surface of the substrate.

The electronic component further may comprise an aperture and the fixing member is at least partially arranged in the aperture. In some embodiments, the die pad extends from the plastic housing and the aperture is arranged in the die pad and adjacent the plastic housing. the electronic component may comprise at least two leads extending from the plastic housing. A second surface of the die pad that opposes the first surface of the die pad may be exposed from the plastic housing, or covered by the plastic housing.

In some embodiments, the resilient member comprises a helical spring. The helical spring has a longitudinal axis that extends substantially perpendicular to the upper side of the electronic component in the assembly. In some embodiments, the upper side of the electronic component further comprises an indentation for accommodating at least a portion of the resilient member.

In some embodiments, the fixing member includes a head and pin, the pin is arranged in the aperture and extends through a further aperture in the substrate, wherein the resilient member is engaged under compression between the upper side of the electronic component and an underside of the head of the pin. The assembly may further comprise a securing member that engages with the fixing member on a second side of the substrate that opposes the first side of the substrate to secure the electronic component to the first side of the substrate. The securing member may comprise a screw having a threaded portion that engages with an inner threaded portion of the pin, or the securing member may mechanically engage the outer surface of the pin. The pin may comprise an electrically conductive material, or an electrically insulative material. In some embodiments, the fixing member comprises a clamp mounted on the first side of the substrate.

The substrate of the assembly may be a heatsink or a circuit board. The force applied to the electronic component by the fixing member and the resilient member is between 0.2 Nm and 2 Nm, preferably between 0.5 Nm and 1 Nm. The electronic component may comprise a TO220 or TO247 package outline.

A Switched Mode Power Supply is provided that comprises the assembly of any one of the aforementioned embodiments.

In an embodiment, a method for mounting an electronic component to a substrate is provided. The method includes placing an electronic component on a first surface of a substrate, the electronic component comprising a heat-generating semiconductor device, a die pad and a plastic housing, wherein the heat generating semiconductor device is mounted on a first surface of the die pad and the die pad is at least partially embedded in the plastic housing, placing a resilient member between an upper side of the electronic component and a lower surface of a fixing member and securing the fixing member to the substrate such that the resilient member is compressed between the upper side of the electronic component and the lower surface of the fixing member and such that a lower surface of the electronic component is pressed onto the first surface of the substrate to mount the electronic component on the substrate.

A force of between 0.2 Nm and 2 Nm, preferably between 0.5 Nm and 1 Nm, may be applied to the electronic component by securing the fixing member to the substrate.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1:
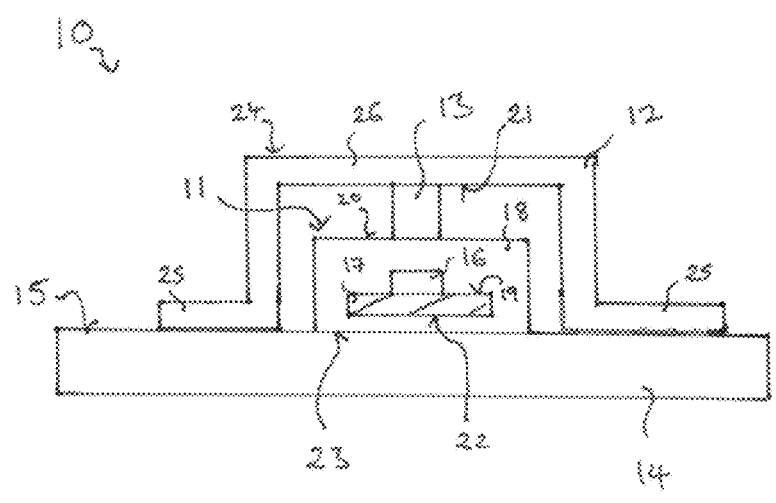
FIG. 1 illustrates a schematic cross-sectional view of an assembly according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a planar substrate, such as a circuit board, or semiconductor carrier such as a die pad. The lateral direction thus extends generally parallel to these surface or sides. In contrast thereto, the term "vertical" or "vertical direction" is understood to mean a direction that runs generally perpendicular to these surfaces or sides and thus to the lateral direction. The vertical direction therefore runs in the thickness direction of the substrate or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

It is desirable that an electronic component can be mounted on a substrate for use in an application in a simple, efficient and reliable manner in order to achieve good thermal contact between the electronic component and the substrate and to enable effective heat dissipation from a heat generating component, such as a transistor device, within the package of the electronic component via the substrate. Furthermore, electronic components may be used in an application over long periods of time, for example 5 years, 10 years or 20 or more years. If the mechanical connection between the electronic component and the substrate becomes loosened over time, such that the force between the electronic component and the substrate is reduced, the thermal resistance of the path between the heat generating semiconductor device and the substrate increases, thus increasing the thermal load which may reduce performance or even lead to failure of the semiconductor device. In some applications, it is difficult or undesirable to tighten a mechanical connection between the electronic component and the substrate after operation of the electronic component in the application has begun.

The assembly according to one or more of the embodiments described herein may be used to mount an electronic component to a substrate using a mechanical connection which is easy to apply. Furthermore, the mechanical connection may be more stable over a period of time, thus providing a thermal resistance which is more stable over a period of time to improve the reliability of the electronic component. The electronic component may include one or more power semiconductor devices, for example a switching device such as a transistor or a diode. The application, in which the assembly is used, may be a Switched Mode Power Supply, DC-DC conversion, AC-DC conversion, or a battery management circuit, for example.

FIG. 1 illustrates a schematic cross-sectional view of an assembly 10 including an electronic component 11, a fixing member 12, a resilient member 13 and a substrate 14 having a first surface 15 on which the electronic component 11 is secured. The electronic component 11 includes one or more heat generating semiconductor devices 16, a die pad 17 and a plastic housing 18. The heat generating semiconductor device 16 is mounted on a first surface 19 of the die pad 17. The die pad 17 is at least partially embedded in the plastic housing 18. The resilient member 13 is engaged under compression between an upper side 20 of the electronic component 11 and a lower surface 21 of the fixing member 12. The fixing member 12 secures the electronic component 11 to the first surface 15 of the substrate 14.

The heat generating semiconductor device 16 may include a power semiconductor device such as a diode or a transistor device, such as a MOSFET (Metal Oxide Semiconductor Field Effect Transistor) or Insulated Gate Bipolar Transistor (IGBT). The die pad 17 may include a metal such as copper. The semiconductor device 16 may be mounted on the first surface 19 of the die pad 17 by a solder connection and may also be electrically coupled to the die pad 17. The electronic component 11 also includes outer contacts, which cannot be seen in the cross-sectional view of FIG. 1, which are exposed from the plastic housing 18 and are electrically coupled to the semiconductor device 16 by conductive internal connections, such as one or more bond wires or one or more contact clips. The electronic component 11 may include a package that conforms to a JEDEC standard, for example a TO 220 or TO247 package.

The substrate 14 may be a heatsink and may include a metal plate such as a copper plate. However, the substrate 14 may also be a redistribution board such as a printed circuit board.

In the assembled state, the fixing member 12 is spaced apart from the electronic component 11 and the resilient member 13 provides the only physical contact between the electronic component 11 and the fixing member 12. The resilient member 13 may include a spring, such as a helical spring, which, in the assembled state, extends between the upper side 20 of the electronic component 11 and the lower side 21 of fixing member 12 and is engaged under compression between the upper side 20 of the electronic component 11 and the underside 21 of the fixing member 12.

In embodiments in which the resilient member 13 is a helical spring, the helical spring has a longitudinal axis that extends substantially perpendicular to the upper side 20 of the electronic component 11. In some embodiments, the upper side 20 of the electronic component 11 further includes an indentation for accommodating at least a portion of the resilient member 13. The indentation may be used to assist the initial positioning of the resilient member 13 before the fixing member 12 is secured to the substrate 14 and/or electronic component 11 and to restrict the lateral movement of the resilient member 13 during and after application of the compressive force to the resilient member 13 by the fixing member 12.

In regions outside of resilient member 13, the assembly 10 may include a gap between the upper side 20 the electronic component 11 and the lower side 21 of the fixing member 12. The assembly 10 may also include a gap between all outside surface of the electronic component 11 and the fixing member 12 in regions outside of the resilient member 13. This gap may provide a distance between the lower side 21 of the fixing member 12 and the upper side 20 of the electronic component 11 which in combination with the spring constant of the resilient member 13 provides the desired force and resilience for the mechanical connection between the electronic component 11 and the substrate 14. The upper side 20 of the electronic component 11 on which the resilient member 13 is positioned, may be provided by a portion of the plastic housing 18 or a portion of an exposed region of the die pad 17.

The fixing member 12 is used to provide the mechanical connection between the electronic component 11 and the substrate 14 and in particular presses the lower side 23 of the electronic component 18, which opposes the upper side 20 of the electronic component 11 on which the resilient member 13 is positioned, into the first surface 15 of the substrate 14.

The fixing member 12 may be considered to be a fastening member or fixture and may have different forms. In some embodiments, such as those illustrated in FIGS. 1 and 2, the fixing member may include a clamp 24 which itself has a certain resilience and which has one or more regions 25 which are mounted on the first surface 15 of the substrate 14 and a web portion 26 which extends over and is spaced apart from the upper side 20 and side faces of the electronic component 11. The underside of the web portion 26 is in mechanical contact with the resilient member 13 such that the clamp 24 exerts a compressive force onto the resilient member 13 and exerts a force onto the electronic component 11 pushing the underside 23 of the electronic component 11 into contact with the first surface 15 of the substrate 14.

However, the fixing member 12 is not limited to having the form of a clamp and may have other forms, such as a push-pin or spring-loaded pin, or spring-loaded nut and bolt.

The torque which is applied to the fixing member 12 to secure the electronic component 11 to the first surface 15 of the substrate 14 may be selected to increase the thermal contact between the lower side 23 of the electronic component 11 and the first surface 15 of the substrate and to decrease the thermal contact resistance of this interface. In some embodiments, the force applied to the electronic component 11 by the fixing member 12 and resilient member 13 is between 0.2 Nm and 2 Nm and preferably between 0.5 Nm and 1 Nm.

If the fixing member is a clamp, this torque may be provided by adjusting the size and shape of the clamp and/or the spring constant of the clamp, for example.

In some embodiments, the semiconductor device 6 and the die pad 17 are entirely embedded within the plastic housing 18. In other embodiments, one or more surfaces of the die pad 17 may be exposed from the plastic housing 18. For example, the lower surface 22 of the die pad 17 may be exposed in a lower side 23 of the electronic component 11. In some embodiments, the die pad 17 may extend through a side face of the plastic housing 18 such that a portion of the die pad 17 is exposed from the plastic housing 18 and provides a heatsink or heat slug. An example of this arrangement is a TO 220 package.

The outer contacts are used to electrically connect the semiconductor device 16 to an external circuit and may have the form of pins or leads which extend from a side face of the plastic housing 18. The pins may be used to mount the electronic component 11 on the first surface 15 of the substrate 14 in the case of a Surface Mount Device. The pins may be inserted in through holes of the substrate in the case of a Through-Hole Device. In embodiments in which the electronic component 11 is a Through-Hole Device, the pins of the electronic component 11 may be mounted in a further substrate which is separate from the substrate 14. The further substrate may be a circuit board, such as a printed circuit board, for example.

Figure 2:
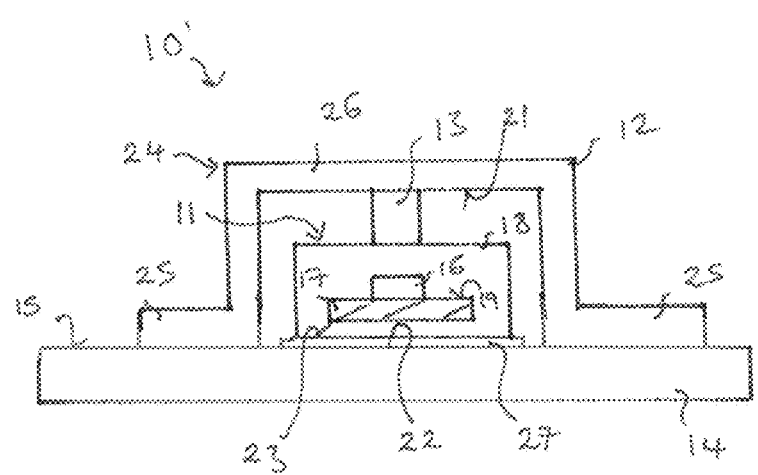
FIG. 2 illustrates a schematic cross-sectional view of an assembly with an additional insulating layer according to an embodiment according to an embodiment.

In some embodiments, such as that illustrated in FIG. 2, the assembly 10' further includes a layer 27 of insulating material between the lower side 23 of the electronic component 11, for example the lower side of the plastic housing 18, and the first surface 15 of the substrate 14. The layer 27 may occupy any space which would otherwise result in an air gap between the lower side 23 of the electronic component 11 and the first surface 15 of the substrate 14 and may be used to reduce the thermal resistance of the interface between the lower side 23 of the electronic component 11 and the first surface 15 of the substrate 14. The layer 27 of insulating material may include an electrically insulating material and may include thermal grease, mica or rubber, for example.

In embodiments in which the second surface 22 of the die pad 17 is positioned entirely within the plastic housing, the layer 27 of insulating material may include thermal grease. In embodiments in which the lower surface of the die pad 17 is exposed from the plastic housing 18 or a portion of the die pad 17 extends from side face of the plastic housing 18 to form a metallic heatsink or heat slug that is exposed from the plastic housing 18, the layer 27 of insulating material may have a lateral extent which is larger than the lateral extent of the plastic housing 18 and die pad 17 such that it electrically insulates the die pad 17 and heatsink from the substrate 14.

Figure 3:
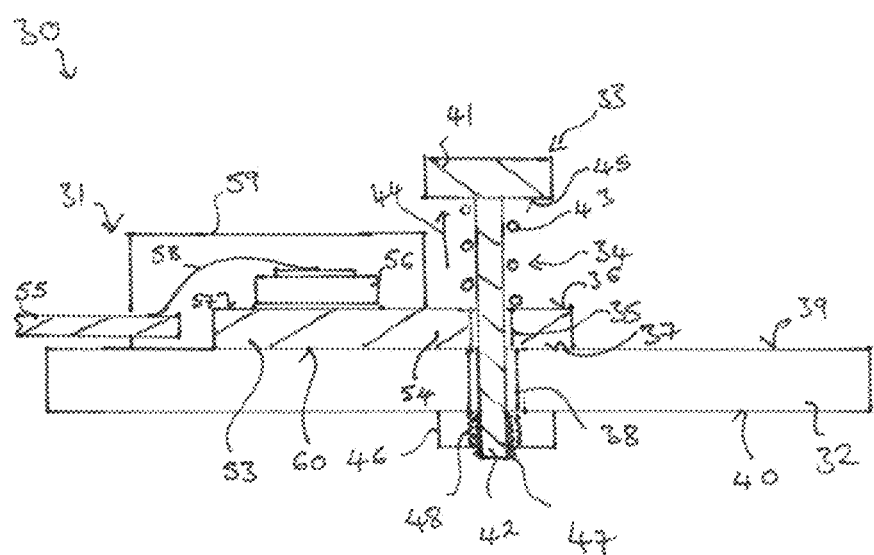
FIG. 3 illustrates a schematic cross-sectional view of an assembly according to an embodiment.

FIG. 3 illustrates a schematic cross-sectional view of an assembly 30 including an electronic component 31, a substrate 32, a fixing member 33 and a resilient member 34. In this embodiment, the electronic component 31 includes an aperture 35 which extends through the electronic component 31 from the upper side 36 to the lower side 37 of the electronic component 31 and which may be used to attach the electronic component 31 to a further member such as the substrate 32. The substrate 32 also includes an aperture 38 which may extend through its thickness from the first surface 39 to the second surface 40. The aperture 38 in the substrate 32 may have a lateral extent which is substantially the same as the lateral extent of the aperture 35 in the electronic component 31.

In embodiments in which the electronic component 31 includes an aperture 35, the electronic component 31 may conform to a standard JEDEC package outline such as a TO220 package outline or a TO247 package outline.

In embodiments in which the electronic component 31 includes an aperture 35, the fixing member 33 may include a T-shape having a head 41 and pin or shaft 42. The head 41 is laterally larger than the pin 42 and the pin 42 extends from an underside of the head 41. The fixing member may have the form of a screw or bolt. In combination with the resilient member 34, the fixing member 33 may be considered to be a push-pin, or spring-loaded pin.

The pin 42 is inserted into the aperture 35 in the electronic component 31 and into the aperture 38 in the substrate 32. The resilient member 34 is arranged between the head 41 and the upper side 36 of the electronic component 31 and may be arranged around, and, in some embodiments, concentrically with, the aperture 35.

In this particular embodiment, the resilient member 34 has the form of a helical spring 43. The helical spring 43 has a longitudinal axis 44 which is arranged substantially perpendicular to the upper side 36 of the electronic component 31 and a first surface 39 of the substrate 32. The helical spring 43 is engaged under compression between the upper side 36 of the electronic component 31 and a lower surface 45 of the fixing member 33, in particular, the lower surface 45 of the head 41. The pin 42 is mechanically secured to the substrate 32 in order to fasten the electronic component 31 to the substrate 32 and, in particular, to mount the lower surface of the electronic component 31 on the first surface 39 of the substrate 32. The head 41 and the pin 42 may be electrically conductive or electrically insulating. The helical spring 43 may be electrically conductive or electrically insulating.

The pin 42 may be secured to the substrate 32 in various ways. In some embodiments, the assembly 30 further comprises a securing member 46. The securing member 46 is arranged on the second surface 40 of the substrate 32 and, therefore, on the opposing side of the substrate to the head 41 and electronic component 11. The securing member 46 engages with the fixing member 33 adjacent the second surface 40 of the substrate 32 to secure the electronic component 31 to the substrate 32 and, in particular, to mount the electronic component 31 on the first surface 39 of the substrate 32.

In some embodiments, the securing member is physically separate from the substrate 32. In other embodiments, the securing member may be attached to the second surface 40 of the substrate 32 or may be integral with the substrate 32.

In some embodiments, such as that illustrated in FIG. 3, the securing member 46 engages or mates with the outer surface of a distal portion of the pin 42 which protrudes from the aperture 38 in the substrate 32 at the second surface 40. The pin 42 may include an outer thread 47 and the further securing member 46 has the form of a nut having an inner thread 48 that engages the outer thread 47 of the pin 42. The head 41 and pin 42 may be provided by a M3 or M4 screw, for example. The distance between the lower surface of the fixing member 32, in particular the lower surface 45 of the head 41, and the upper surface 36 of the electronic component 31 may be 5 mm to 15 mm.

Figure 4:
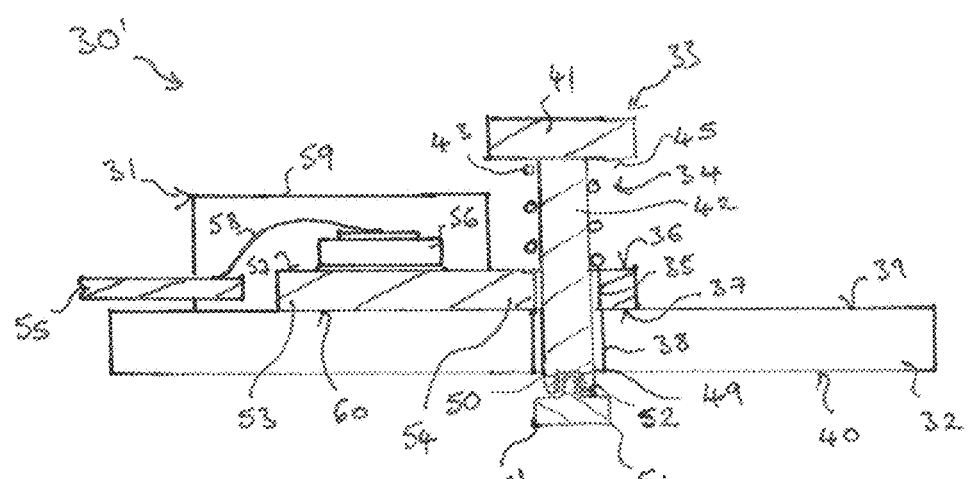
FIG. 4 illustrates a schematic cross-sectional view of an assembly according to an embodiment.

In other embodiments, such as that illustrated in FIG. 4, the pin 42 may include an aperture 49 in its distal end, in particular, a longitudinal aperture 49 and the securing member 46' may engage or mate with the inner surface of the aperture 49. At least the distal end of the aperture 49 may include an inner thread 50 and the securing member 46' may include a screw 51 in which the shaft of the screw 51 has an outer thread 52 which can engages with the inner thread 50 of the pin 42. The aperture 49 may have a height that is greater than the height of the shaft of the screw 51 in order than in the assembled state the head of the screw is in contact with the second surface 40 of the substrate 40. In some embodiments, the pin 41 may be a split pin including two or more segments extending in parallel to the longitudinal axis of the pin 41.

In the assembled state the securing member 46, 46' is typically in direct contact with the second surface 40 of the substrate 32 in order to fasten the fixing member 33 to the substrate 32.

In some embodiments, the fixing member 33 may be secured to the substrate without the use of a further securing member. For example, the pin 42 may include flexible protrusions or flaps which enable the pin 42 to be inserted through the apertures 35, 36 and upon emergence from the aperture 36 on the second surface 40 of the substrate 32 move laterally to provide an abutment surface engaging the second surface 40 of the substrate 32 to secure the fixing member to the substrate 32.

The torque which is applied to the fixing member 33 to secure the electronic component 31 to the first surface 39 of the substrate 32 may be selected so as to increase the thermal contact between the lower side 37 of the electronic component 31 and the first surface 39 of the substrate 32 and to decrease the thermal contact resistance of this interface. In some embodiments, the force applied to the electronic component 31 by the fixing member 33 and resilient member 34 is between 0.2 Nm and 2 Nm and preferably between 0.5 Nm and 1 Nm.

In the embodiment illustrated in FIGS. 3 and 4, the electronic component 31 includes a die pad 53 which extends into a heatsink 54 and three leads or pins 55, of which only one can be seen in the cross-sectional views of FIGS. 3 and 4, which are arranged on adjacent a side face of the die pad 53 which opposes the heatsink 54. The aperture 35 is positioned in the heatsink 54. The electronic component 31 includes one or more heat generating semiconductor devices 56 which are mounted on an upper surface 57 of the die pad 53. The heat generating semiconductor device 56 may include a transistor device or diode, for example a power MOSFET device or a power IGBT transistor device. The heat generating semiconductor device 56 is electrically coupled to the leads 55 by the use of one or more connectors such as a bond wire 58 or a contact clip.

The electronic component 31 also includes a plastic housing 59 which covers at least the upper surface 57 of the die pad 53, the heat generating semiconductor device 56, the connectors 58 and portions of the leads 55 arranged adjacent the die pad 53. In the embodiments illustrated in FIGS. 3 and 4, the lower surface 60 of the die pad 53, the heatsink 54 and distal portions of the leads 55 may remain exposed from the plastic housing 56. In other embodiments, such as that illustrated in FIG. 5, the lower surface 60 of the die pad 53 and the heatsink 54 may also be covered by the plastic housing 59.

In some electronic components, such as an electronic component conforming to TO 220 package outline, the upper side 36 of the electronic component 31 is not planar. In particular, the electronic component 31 has a greater thickness in regions above the die pad 53 than in the portion occupied by the heatsink 54. However, in some embodiments, the electronic component has an upper surface which is substantially planar.

The pin 42 and the helical spring 43 may have a length such that in the assembled state the lower surface 45 of the head 41 is positioned in a plane above the plane of the plastic housing 59 in regions above the die pad 53. The distance between the lower surface 45 of the head 41 and the upper surface 36 of the electronic component 31 in regions above the die pad 54 may lie in the region of 5 mm to 15 mm.

Figure 5:
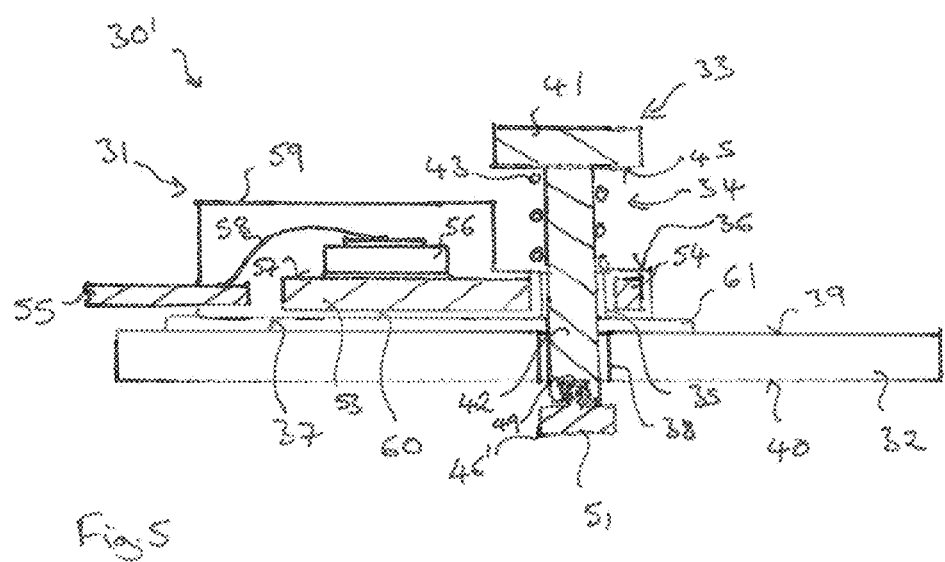
FIG. 5 illustrates a schematic cross-sectional view of an assembly with an additional insulating layer according to an embodiment.

The assembly 30, 30' may also further include a further insulating layer 61 which is arranged between the lower side 37 of the electronic component 31 and the first surface 39 of the substrate 32, as is illustrated in FIG. 5. The lateral extent of the insulating layer 61 may be the same as or greater than the footprint of the electronic component 31 and, therefore, entirely cover the interface between the lower surface 37 of the electronic component 31 and the first surface 39 of the substrate 32. The further insulating layer 61 may include thermal grease, mica or rubber, for example. If the die pad 53 is exposed from the plastic housing 59, the insulating layer may provide electrical insulation of the die pad 53 from the underlying substrate 32.

Figure 6:
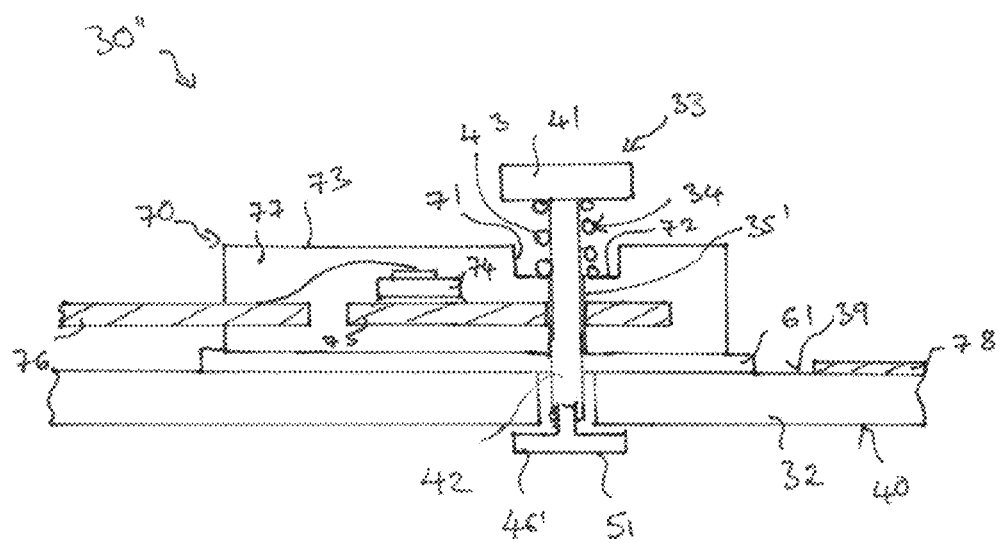
FIG. 6 illustrates a schematic cross-sectional view of an assembly according to an embodiment.

In some embodiments, the electronic component further includes an indentation in its upper surface for accommodating a portion of the resilient member. FIG. 6 illustrates an example of such an assembly 30" in which an electronic component 70 includes an indentation 71 in its upper surface 72 for accommodating a portion of the resilient member 34. In the embodiment illustrated in FIG. 6, the electronic component 70 include an aperture 35' and the indentation 71 forms part of the aperture 35' in the electronic component 70 such that the aperture 35' has a stepped form providing a ledge or seat 72 is sized, shaped and arranged to accommodate a portion of the resilient member 34. In the illustrated embodiment, the resilient member is a helical spring 43, the fixing member 33 includes a head 41 and pin 42 and the electronic component 70 includes a TO 247 package outline.

The use of an additional indentation 71 may assist in defining the lateral position of the resilient member 33 and reducing the overall height of the assembly 30". The indentation 71 may have a diameter which is selected such that the resilient member 33, when placed under compression between the fixing member 32 and the seat 72 in the upper side 73 of the electronic component 70, is spaced at a distance from the side faces of the indentation 71 and from the outer side faces of the pin 42.

The electronic component 70 includes one or more heat generating semiconductor devices 74 mounted on a die pad 75, one or more leads 76 that are electrically coupled with the semiconductor device or devices and a plastic housing 77. The aperture 35 is arranged in the die pad 75 in a portion adjacent the semiconductor device 74 that may provide a heatsink. The upper surface of the electronic component 70 is substantially planar in regions outside of the indentation 71. The die pad 75 may be partially or completely embedded in the plastic housing 77.

In FIG. 6, the substrate 32 is a redistribution board including a conductive redistribution structure 78. However, the substrate 32 may also be a heatsink that includes a metal, for example a copper plate.

An indentation for accommodating apportion of the resilient member may also be arranged in the upper side of other types of electronic components, such as the electronic components 11, 31 illustrated in FIGS. 1 to 5.

Figure 7:
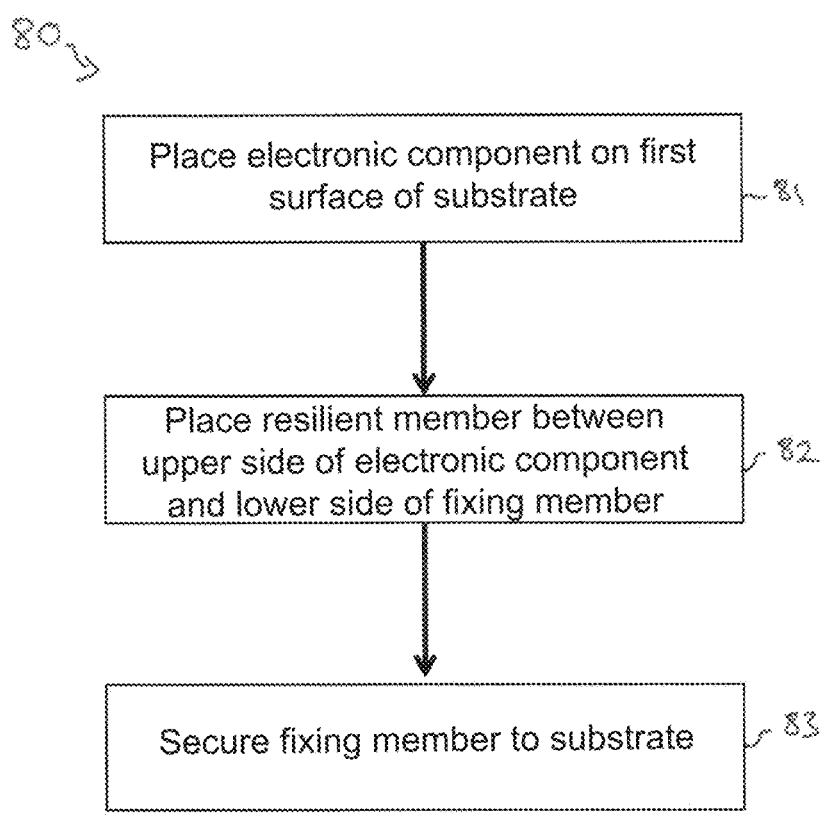
FIG. 7 illustrates a flow chart of a method for mounting an electronic component to a substrate.

FIG. 7 illustrates a flowchart 80 of a method for mounting an electronic component to a substrate. In block 81, an electronic component is placed on a first surface of the substrate. The electronic component includes one or more heat generating devices, a die pad and a plastic housing. The heat generating semiconductor device is mounted on a first surface of the die pad and the die pad is at least partially embedded in the plastic housing. In block 82, a resilient member is placed between an upper side of the electronic component and a lower side of the fixing member. The lower side of the electronic component may be placed on the first surface of the substrate. In block 83, a fixing member is secured to the substrate such that the resilient member is compressed between the upper side of the electronic component and the lower side of the fixing member and such that the lower side of the electronic component is pressed onto the first surface of the substrate to mount the electronic component on the substrate.

In some embodiments, a force of between 1.2 Nm and 2 NM, preferably 0.5 Nm and 1 Nm, is applied to the electronic component by fastening the fixing member to the substrate.

In embodiments in which the fixing member is a clamp, the fixing member may be fastened to the first surface of the substrate and may extend over one or more side faces of the electronic component.

In some embodiments, in which the fixing member is provided by a push-pin or spring-loaded pin arrangement, a portion of the fixing member is inserted through the resilient member, the electronic component and the substrate and may be mechanically fastened to the second side of the substrate which opposes the first surface of the substrate on which the electronic component is positioned. In these embodiments, a further securing member may be arranged on the second surface of the substrate which mechanically engages with the fixing member to secure the fixing member and press the electronic component onto the first surface of the substrate to mount the electronic component on the substrate.

In embodiments in which the resilient member is a helical spring and the fixing member includes a head and pin, the pin is inserted into the helical spring along its longitudinal axis such that the turns of the helical spring surround the pin and such that the helical spring is arranged between the head and the upper side of the electronic component. The fixing member is secured to the substrate and such that the helical spring is compressed between a lower surface of the head of the resilient member and an upper side of the electronic component, thus reducing its length, and such that the electronic component is mechanically attached to the substrate.

Figure 8:
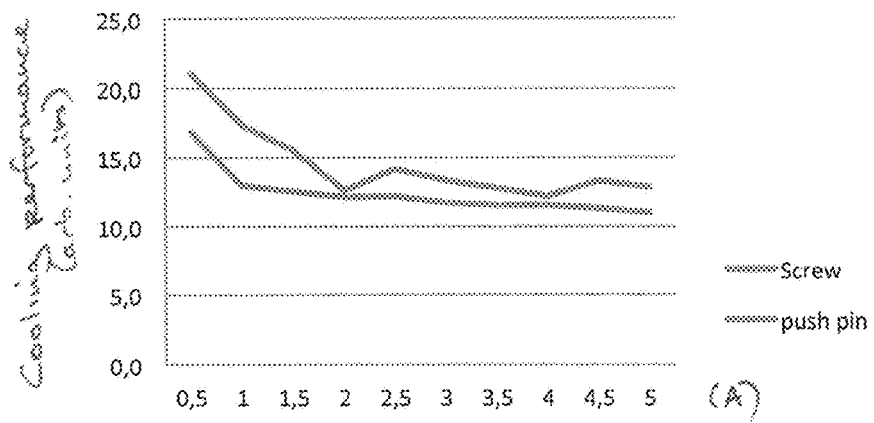
FIGS. 8a and 8b illustrate cooling performance measured for an electronic component mounted onto a substrate using a screw and for an electronic component mounted onto a substrate using a push pin.
Figure 8:
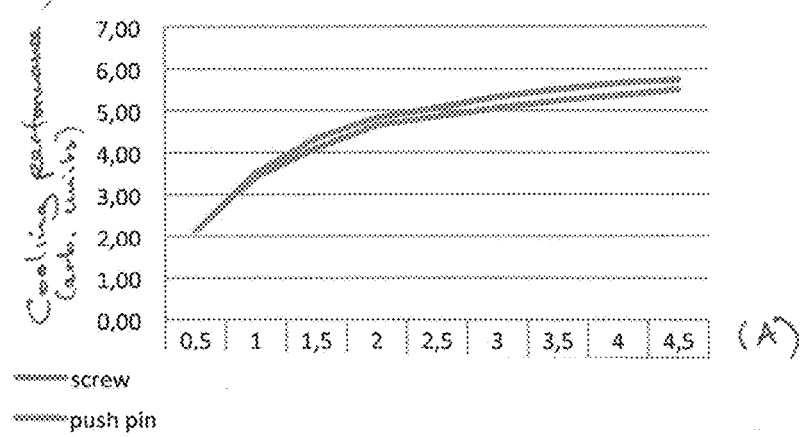

FIGS. 8a and 8b illustrate cooling performance measured for an electronic component mounted onto a substrate using a screw and for an electronic component mounted onto a substrate using a push pin.

FIG. 8a illustrates results obtained for an assembly including an electronic component with a transistor device in a TO-220 package and a push-pin including a pin and helical spring used to secure the electronic component to a copper substrate and a comparison assembly, in which the electronic component including an electronic component with a transistor device in a TO-220 package is mounted on a copper substrate using a screw. In both assemblies an insulation layer was arranged between the lower surface of the electronic component and the copper substrate.

FIG. 8a illustrates a graph of cooling performance in arbitrary units as a function of current in amps applied to the transistor for both assemblies. The graph indicates that the cooling performance of the assembly with the push-pin is similar to the cooling performance displayed by the assembly with the screw.

FIG. 8b illustrates a graph of cooling performance in arbitrary units as a function of current in amps applied to the transistor. This graph also indicates that the cooling performance of the assembly with the push-pin is similar to the cooling performance displayed by the assembly with the screw.

The use of a fixing member and a resilient member, such as a pin and helical spring, respectively, of a push pin to mount an electronic component to a substrate, such that in the assembled state the resilient member is engaged under compression between an upper side of the electronic component and a lower surface of the fixing member and such that the fixing member secures the electronic component to the substrate, enables the electronic component to be mounted to the substrate in a simple manner without increasing the thermal resistance to an undesirable degree.

The assembly according to any one of the embodiments described herein may be used in applications in which it is difficult or undesirable to tighten a mechanical connection between the electronic component and the substrate after operation of the electronic component in the application has begun. The assembly according to one or more of the embodiments described herein may be used to mount an electronic component to a substrate using a mechanical connection which is more stable over a period of time, thus providing a thermal resistance which is more stable over a period of time, for example 5 years, 10 years or 20 or more years, and improved reliability in comparison to a fastening including a screw and no resilient member, such as a helical spring. The electronic component may include one or more power semiconductor devices, for example a switching device such as a transistor or a diode. The application in which the assembly is used may be a Switched Mode Power Supply, DC-DC conversion, AC-DC conversion, or a battery management circuit, for example.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An assembly, comprising:
    an electronic component comprising:
        a semiconductor device;
        a die pad; and
        a plastic housing;
        wherein the semiconductor device is mounted on a first surface of the die pad and the die pad is at least partially embedded in the plastic housing;
    a fixing member;
    a resilient member; and
    a substrate having a first surface;
    wherein the resilient member is engaged under compression between an upper side of the electronic component and a lower surface of the fixing member, and the fixing member secures the electronic component to the first surface of the substrate,
    wherein the resilient member is a helical spring.

2. The assembly of claim 1, wherein the electronic component further comprises an aperture and the fixing member is at least partially arranged in the aperture.

3. The assembly of claim 2, wherein the die pad extends from the plastic housing, and wherein the aperture is arranged in the die pad and adjacent the plastic housing.

4. The assembly of claim 2, wherein the fixing member includes a head and pin, wherein the pin is arranged in the aperture and extends through a further aperture in the substrate, and wherein the resilient member is engaged under compression between the upper side of the electronic component and an underside of the head of the pin.

5. The assembly of claim 4, wherein the assembly further comprises a securing member that engages with the fixing member on a second side of the substrate that opposes the first side of the substrate, to secure the electronic component to the first side of the substrate.

6. The assembly of claim 5, wherein the securing member comprises a screw having a threaded portion that engages with an inner threaded portion of the pin, or the securing member mechanically engages the outer surface of the pin.

7. The assembly of claim 1, wherein a second surface of the die pad that opposes the first surface is exposed from the plastic housing or covered by the plastic housing.

8. The assembly of claim 1, wherein the upper side of the electronic component further comprises an indentation for accommodating at least a portion of the resilient member.

9. The assembly of claim 1, wherein a force applied to the electronic component by the fixing member and the resilient member is between 0.2 Nm and 2 Nm.

10. The assembly of claim 1, wherein the electronic component has a TO220 or TO247 package outline.

11. A Switched Mode Power Supply comprising the assembly of claim 1.

12. A method for mounting an electronic component to a substrate, the method comprising:
    placing an electronic component on a first surface of a substrate, the electronic component comprising a semiconductor device, a die pad and a plastic housing, wherein the semiconductor device is mounted on a first surface of the die pad and the die pad is at least partially embedded in the plastic housing;

placing a helical spring between an upper side of the electronic component and a lower surface of a fixing member; and securing the fixing member to the substrate such that the helical spring is compressed between the upper side of the electronic component and the lower surface of the fixing member, and such that a lower surface of the electronic component is pressed onto the first surface of the substrate to mount the electronic component on the substrate.

13. The method of claim 12, wherein a force of between 0.2 Nm and 2 Nm is applied to the electronic component by securing the fixing member to the substrate.

14. The method of claim 12, wherein a force of between 0.5 Nm and 1 Nm is applied to the electronic component by securing the fixing member to the substrate.

15. The method of claim 12, wherein the electronic component further comprises an aperture and the fixing member is at least partially arranged in the aperture.

16. The method of claim 12, wherein the die pad extends from the plastic housing, and wherein the aperture is arranged in the die pad and adjacent the plastic housing.

17. The method of claim 16, wherein the fixing member includes a head and pin, wherein the pin is arranged in the aperture and extends through a further aperture in the substrate, and wherein the helical spring is engaged under compression between the upper side of the electronic component and an underside of the head of the pin.

18. The method of claim 17, wherein the assembly further comprises a securing member that engages with the fixing member on a second side of the substrate that opposes the first side of the substrate, to secure the electronic component to the first side of the substrate.

19. An assembly, comprising:
an electronic component comprising:
    a semiconductor device;
    a die pad; and
    a plastic housing;
    wherein the semiconductor device is mounted on a first surface of the die pad and the die pad is at least partially embedded in the plastic housing;
a clamp;
a resilient member; and
a substrate having a first surface;
wherein the resilient member is engaged under compression between an upper side of the plastic housing and a lower surface of the clamp, and the clamp secures the electronic component to the first surface of the substrate without contacting the electronic component.

20. A method for mounting an electronic component to a substrate, the method comprising:

placing an electronic component on a first surface of a substrate, the electronic component comprising a semiconductor device, a die pad and a plastic housing, wherein the semiconductor device is mounted on a first surface of the die pad and the die pad is at least partially embedded in the plastic housing;

placing a resilient member between an upper side of the electronic component and a lower surface of a clamp; and securing the clamp to the substrate such that the resilient member is compressed between the upper side of the electronic component and the lower surface of the clamp, and such that a lower surface of the electronic component is pressed onto the first surface of the substrate to mount the electronic component on the substrate without the clamp contacting the electronic component.

\* \* \* \* \*

UNITED STATES PATENT AND TRADEMARK OFFICE
CERTIFICATE OF CORRECTION

PATENT NO. : 11,211,304 B2
APPLICATION NO. : 16/104600
DATED : December 28, 2021
INVENTOR(S) : Otremba et al.

Page 1 of 1

It is certified that error appears in the above-identified patent and that said Letters Patent is hereby corrected as shown below:

On the Title Page

Item (56)/other publications (Line 1), please change "interneton" to -- internet on --.

Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*